(12) United States Patent
Yamazaki (10) Patent No.: US 6,367,378 B1
(45) Date of Patent: Apr. 9, 2002

(54) REEL FEED SCREEN PRINTING METHOD AND PRINTING MACHINE

(75) Inventor: Akio Yamazaki, Suita (JP)

(73) Assignee: New Create Corporation, Osaka (JP)

( * ) Notice: Subject to any disclaimer, the term of this patent is extended or adjusted under 35 U.S.C. 154(b) by 0 days.

(21) Appl. No.: 09/628,438

(22) Filed: Jul. 28, 2000

(30) Foreign Application Priority Data

May 8, 2000 (JP) ........................................ 2000-134629

(51) Int. Cl.[7] .............................................. B41M 1/12
(52) U.S. Cl. ................. 101/129; 101/126; 101/DIG. 42
(58) Field of Search ................................. 101/114, 115, 101/116, 118, 123, 124, 126, 129, 420, 424.1, DIG. 42

(56) References Cited

U.S. PATENT DOCUMENTS

| | | | | |
|---|---|---|---|---|
| 3,973,493 A | * | 8/1976 | Black et al. ................. | 101/126 |
| 4,729,305 A | * | 3/1988 | Spencer ....................... | 101/122 |
| 4,781,088 A | * | 11/1988 | O'Connor et al. .......... | 101/228 |
| 4,909,143 A | * | 3/1990 | Van den Berg et al. .... | 101/118 |
| 5,777,878 A | * | 7/1998 | Helmrich et al. ........... | 101/115 |

* cited by examiner

*Primary Examiner*—Ren Yan
(74) *Attorney, Agent, or Firm*—Rader, Fishman & Grauer, PLLC (57) ABSTRACT

This invention relates to a real feed screen printing method and printing machine for performing screen printing while feeding a roll film by a specific stroke, in which the drying oven side of the film is slackened at the time of printing.

4 Claims, 8 Drawing Sheets

REEL FEED SCREEN PRINTING METHOD AND PRINTING MACHINE

TECHNICAL FIELD OF THE INVENTION

The present invention relates to a reel feed screen printing method and printing machine. More particularly, it relates to a reel feed screen printing method and printing machine capable of avoiding contact of the printed portion of the film positioned at the drying oven side with the drying oven inlet or the like.

BACKGROUND ART

Hitherto, as a method of printing an image on a substrate, for example, a printed wiring board, screen printing is known, which is to print on the object of printing rubbing out ink from a stencil screen by means of a squeegee.

Figure 8:
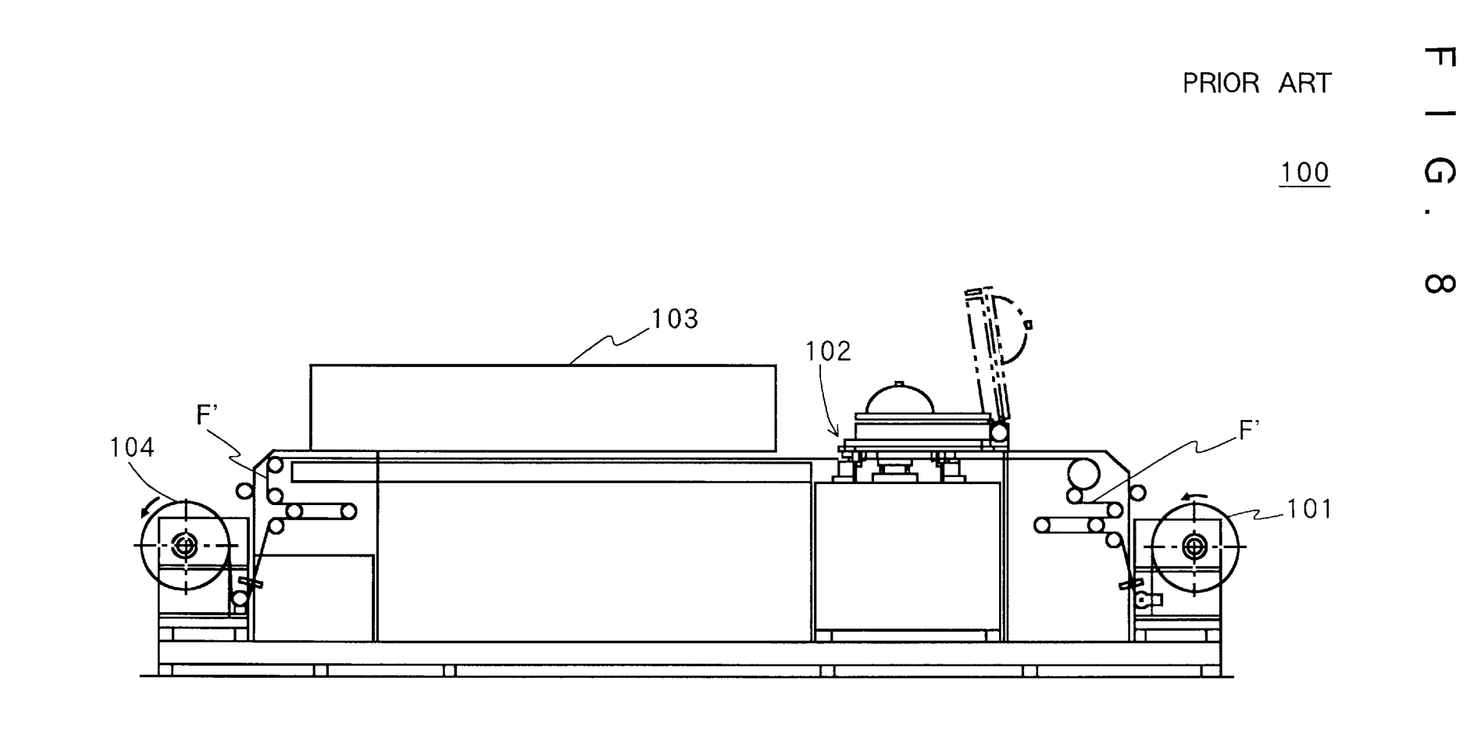
FIG. 8 is a front view showing a schematic structure of a printing machine to which a reel feed screen printing method of a prior art is applied.

FIG. 8 shows a structure of a conventional reel feed screen printing machine. This printing machine 100 reels out a PET film F' coated with a ceramic thin film from a reel feed roller 101 by a specified length each, prints on the ceramic thin film by means of a stencil screen 102, dries the printed portion by a drying oven 103, and takes up by a reel-up roller 104.

Such reel feed printing method is superior in working efficiency and effective to lower the manufacturing cost, as compared with the method of printing on each one of preliminarily cut sheets.

Hitherto, if precise print position is required as in the case of overlap printing of an image on an already printed image, at the time of first printing, a positioning mark is printed together with the print pattern, and this mark is taken by, for example, a CCD camera, and the position of the object of printing is adjusted on the basis of the taken image information.

However, in the positioning method by using image pickup means such as CCD camera, the CCD camera is placed between the object of printing and the screen, and the distance of the object of printing and the screen is wider than usual. Therefore, when bringing the object of printing and the screen closer to each other at the time of printing, the camera must be set aside, and the object of printing or the screen must be moved a relatively long distance, but since the screen requires a considerably wide area than the printing area of the object of printing, when the screen is moved, the camera withdrawing distance is very long, and one process becomes long.

Accordingly, a method of printing by fixing the screen and bringing the object of printing closer to the screen is advantageous in working efficiency, but in this case, in the printing machine 100 in FIG. 8, the PET film F' is lifted about the printing area, and the printed portion may contact with the inlet of the drying oven 103, and the machine may be contaminated or the printing result may be poor.

The invention is devised in the light of the above problems of the prior art, and it is hence an object thereof to present a reel feed screen printing method and printing machine capable of avoiding contact of the printed portion of the film positioned at the drying oven side with the drying oven inlet or the like.

SUMMARY OF THE INVENTION

A first aspect of reel feed screen printing method of the invention is a reel feed screen printing method for performing screen printing while feeding a roll film by a specific stroke, in which the drying oven side of the film is slackened at the time of printing.

A second aspect of reel feed screen printing method of the invention is a reel feed screen printing method for performing screen printing while feeding a roll film by a specific stroke, in which the print table is lifted up to a printing position while moving in the drying oven direction by a specific stroke.

In the reel feed screen printing method of the invention, preferably, the drying oven side of the film is thrust downward.

A first aspect of reel feed screen printing machine of the invention is a reel feed screen printing machine for performing screen printing while feeding a roll film by a specific stroke comprising film slackening means for slackening the drying oven side of the film at the time of printing.

A second aspect of reel feed screen printing machine of the invention is a reel feed screen printing machine for performing screen printing while feeding a roll film by a specific stroke comprising print table sliding and lifting means for lifting the print table up to a printing position while moving in the drying oven direction by a specific stroke.

The reel feed screen printing machine of the invention, preferably, further comprises film downward thrusting means for thrusting the drying oven side of the film downward.

The invention is thus constituted, and hence the printed portion positioned at the drying oven side of the film at the time of printing is prevented from being damaged by contacting with, for example, the upper part of the inlet of the drying oven. Accordingly, the product quality and yield are enhanced, and soiling of the drying oven inlet with ink or the like can be avoided.

DETAILED DESCRIPTION OF THE INVENTION

Referring now to the accompanying drawings, embodiments of the invention are described below, but it must be noted that the invention is not limited to the illustrated embodiments alone.

Figure 1:
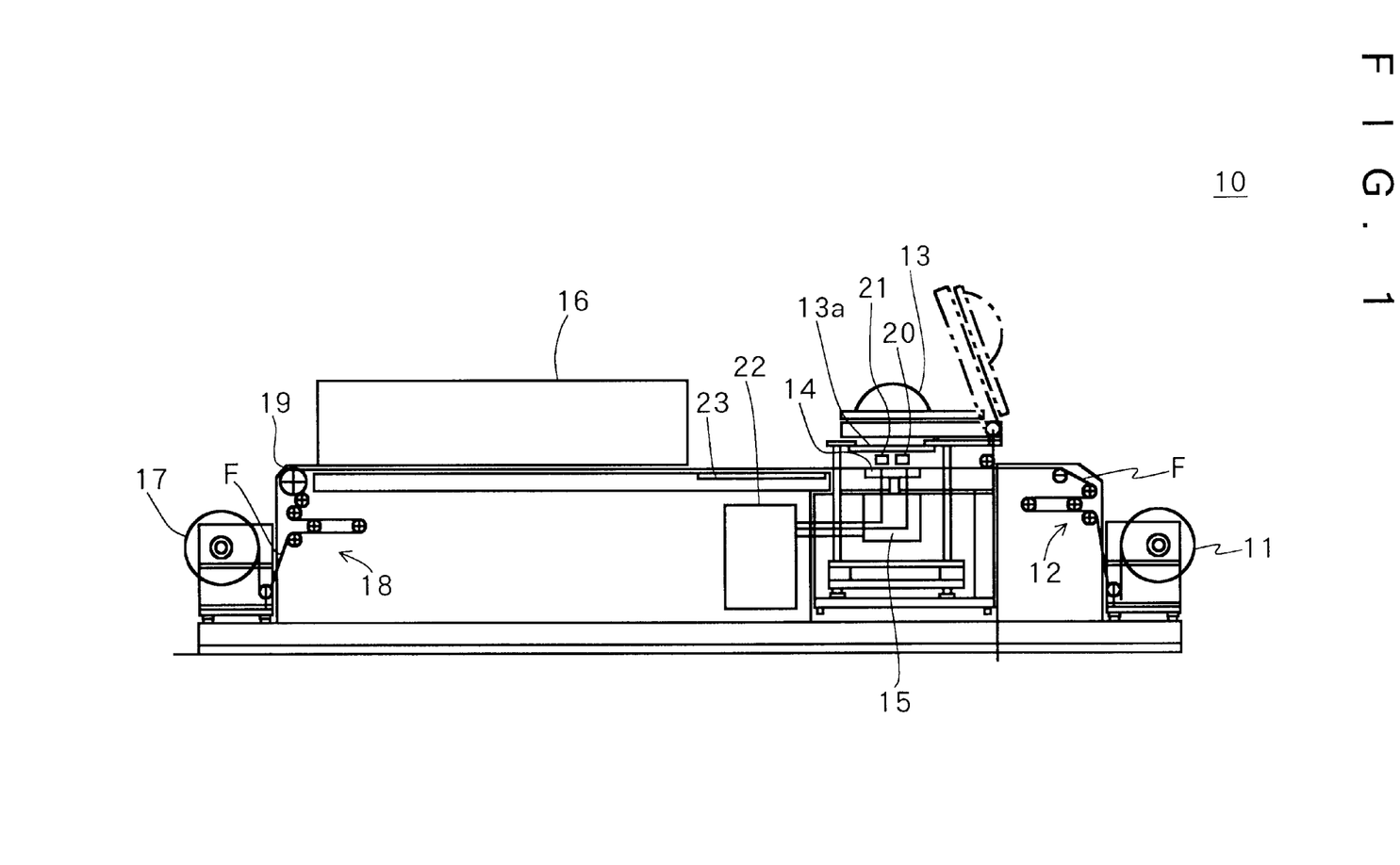
FIG. 1 is a front view showing a schematic structure of a printing machine to which a reel feed screen printing method of an embodiment of the invention is applied.

FIG. 1 shows a schematic structure of a printing machine to which the reel feed screen printing method of embodiment 1 of the invention is applied, in which a printing machine 10 comprises a reel feed roller 11 for feeding a PET film F coated with the object of printing such as ceramic thin film (see FIG. 3) S, a reel feed tension rollers group 12 for providing the PET film F fed from the reel feed roller 11 with a specified tension, a printing mechanism 13 for executing screen printing on the object S of printing, a print table 14 for holding the printing area of the object of printing S when executing printing, a print table driving mechanism 15 for driving the print table 14 so as to move the printing area to the print executing position just beneath the printing mechanism 13, a drying oven 16 for drying the printed area, a reel-up roller 17 for reeling up the printed area dried by the drying oven 16, a reel-up tension rollers group 18 for providing the PET film F reeled up on the reel-up roller 17 with a specified tension, a suction roller 19 for feeding the PET film F by a specified length each by rotating with the PET film F sucked between the drying oven 16 and reel-up tension rollers group 18, a feed stop position detecting mechanism 20 for detecting the stop position of feed action by the suction roller 19, an image pickup mechanism 21 for taking a position mark preliminarily provided in the object of printing, and a controller 22 for controlling the feed action by the suction roller 19 and the positioning action by the print table driving mechanism 15 according to the detection result by the feed stop position detecting mechanism 20 and the image information taken by the image pickup mechanism 21, and also controlling the tension applied to the PET film F by the tension rollers groups 12, 18.

The printing mechanism 13 has a screen 13a of polyester fiber tetron mesh or stainless steel mesh stretched on a hollow frame of, for example, aluminum with a uniform tension, and a stencil having a relief image for printing is placed on the screen 13a, and printing is applied on the object of printing by rubbing out the ink from the screen 13a by means of a squeegee not shown.

The print table 14 has vacuum forming paths 14a connected to a vacuum unit not shown provided inside in vertical and lateral directions (see FIG. 2), and multiple through-holes 14c are formed from the vacuum forming paths 14a toward a platform 14b for mounting the PET film F containing the object of printing S, and the platform 14b is covered with mesh sheet of, for example, stainless steel so as to suck and hold the PET film P containing the object of printing S.

Figure 2:
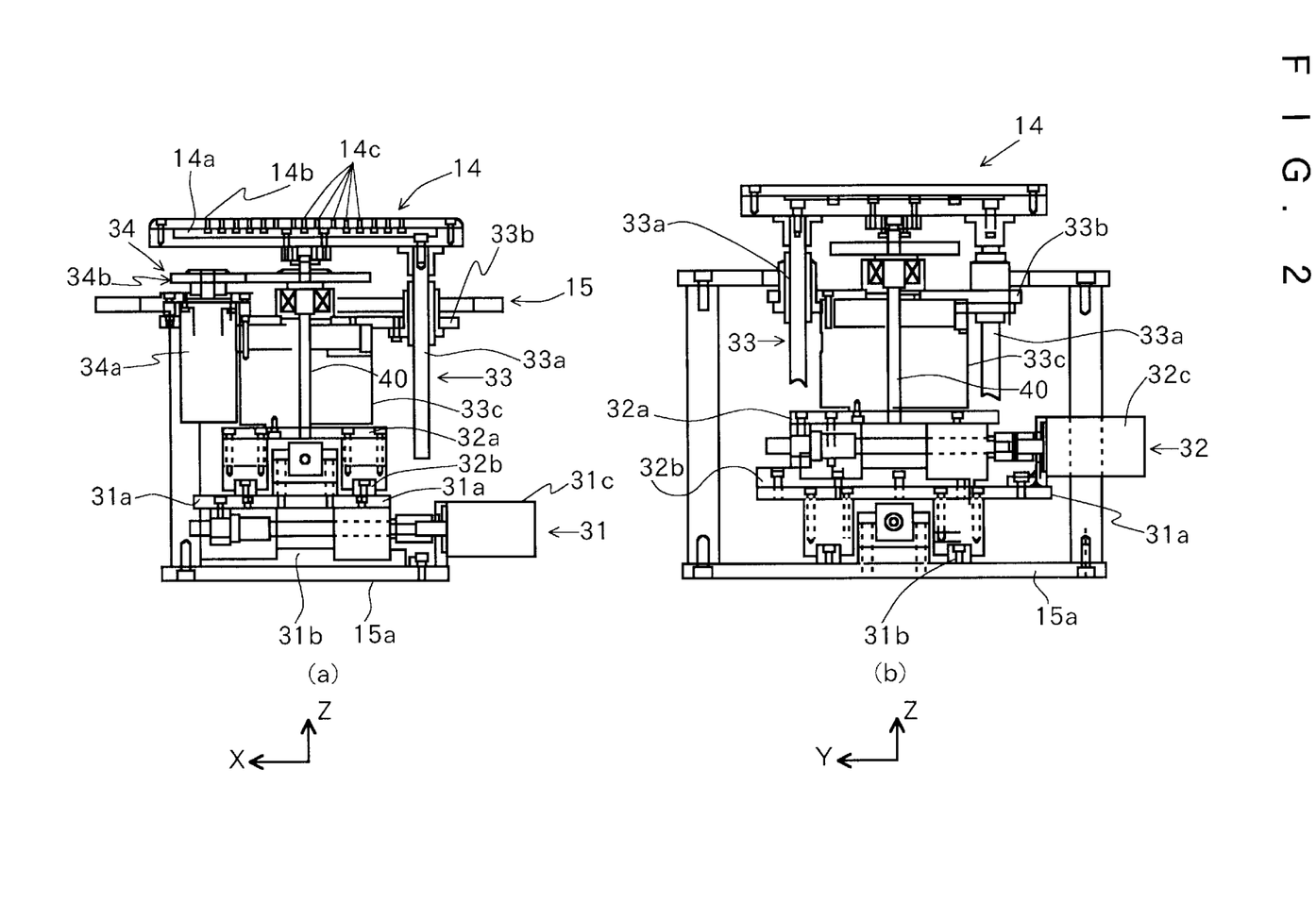
FIG. 2 is a detailed structural drawing of a print table driving mechanism, in which (a) is a view as seen from a direction vertical to the feed direction of the object of printing, and (b) is a view as seen from a direction parallel to the feed direction of the object of printing.

FIG. 2 shows a schematic structure of the print table driving mechanism 15. The print table driving mechanism 15 comprises an X-axis driving mechanism 31 for driving the print table 14 in a direction parallel to feed of PET film F (referred to as X-axis direction), a Y-axis driving mechanism 32 for driving the print table 14 in a direction vertical to feed of PET film F (referred to as Y-axis direction), a rotary driving mechanism 33 for rotating the print table 14 about a rotary shaft 40 supporting it nearly at the center of gravity, and a Z-axis driving mechanism 34 for driving in the vertical direction (referred to as Z-axis direction).

The X-axis driving mechanism 31 comprises an X-axis base 31a, an X-axis rails 31b fixed on the base 15a of the print table driving mechanism 15 for guiding the move of the X-axis base 31a, and an X-axis servo motor 31c for driving the X-axis base 31a along the X-axis rails 31b.

The Y-axis driving mechanism 32 comprises a Y-axis base 32a, a Y-axis rails 32b fixed on the X-axis base 21a for guiding the move of the Y-axis base 32a, and a Y-axis servo motor 32c fixed on the X-axis base 31a for driving the Y-axis base 32a along the Y-axis rails 32b.

The rotary driving mechanism 33 comprises a rotary plate 33b coupled to the print table 14 through plural coupling members 33a, and a rotary servo motor 33c fixed on the Y-axis base 32a for rotating and a driving the print table 14 about the rotary center 40 through the rotary plate 33b.

The Z-axis driving mechanism 34 comprises a Z-axis servo motor 34a fixed on the rotary plate 33b for rotating the rotary shaft 40 to drive the print table 14 in the vertical direction, and a torque transmitting mechanism 34b.

The drying oven 16 is designed to dry the printed portion passing through the oven by the hot air supplied through a duct not shown, and the entrance and exit are formed in a small size so as not to allow the hot air to escape outside.

Between the drying oven 16 and the printing mechanism 13, there is a thrusting mechanism (film downward thrusting means) 23 connected to a vacuum unit not shown for sucking and thrusting the drying oven side of the PET film F vertically downward at the time of printing. The thrusting mechanism 23 is, although not shown, a simplified structure of the sucking and holding mechanism formed in the print table 14, and at the time of printing, the printing area is slid and lifted to the drying oven 16 side as mentioned below, and lifted up to the printing position just beneath the screen 13a, and at this time in order that the slackened portion of the PET film F formed at drying oven 16 side (printed portion) may not contact with the inlet of the drying oven 16 or other member, the PET film F is thrust downward before the inlet of the drying oven 16.

Referring to FIG. 3 to FIG. 6, the configuration of the feed stop position detecting mechanism 20 and image pickup mechanism 21 are described.

Figure 3:
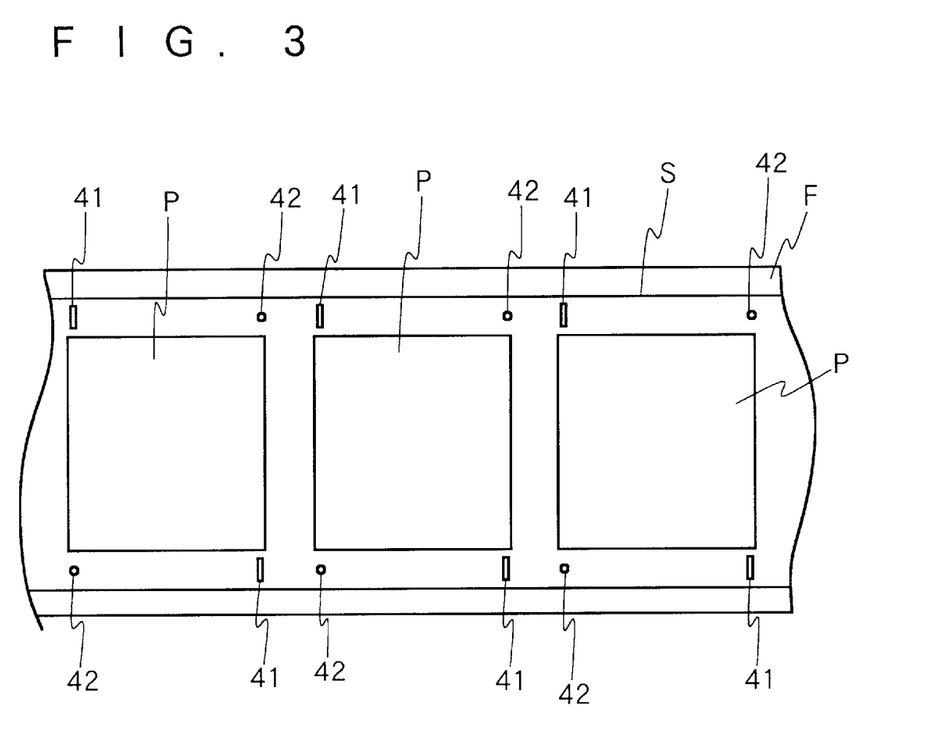
FIG. 3 is a plan view showing the composition of PET film and object of printing.

FIG. 3 shows the detail of the PET film F and the object of printing S formed on this PET film F, and the PET film F is coated with a thin ceramic film as object of printing, for example, as shown in the drawing. On the object of printing S, print patterns P are preliminarily printed at specific intervals, and stop marks 41 and positioning marks 42 are printed at both sides corresponding to the print patterns P.

Figure 4:
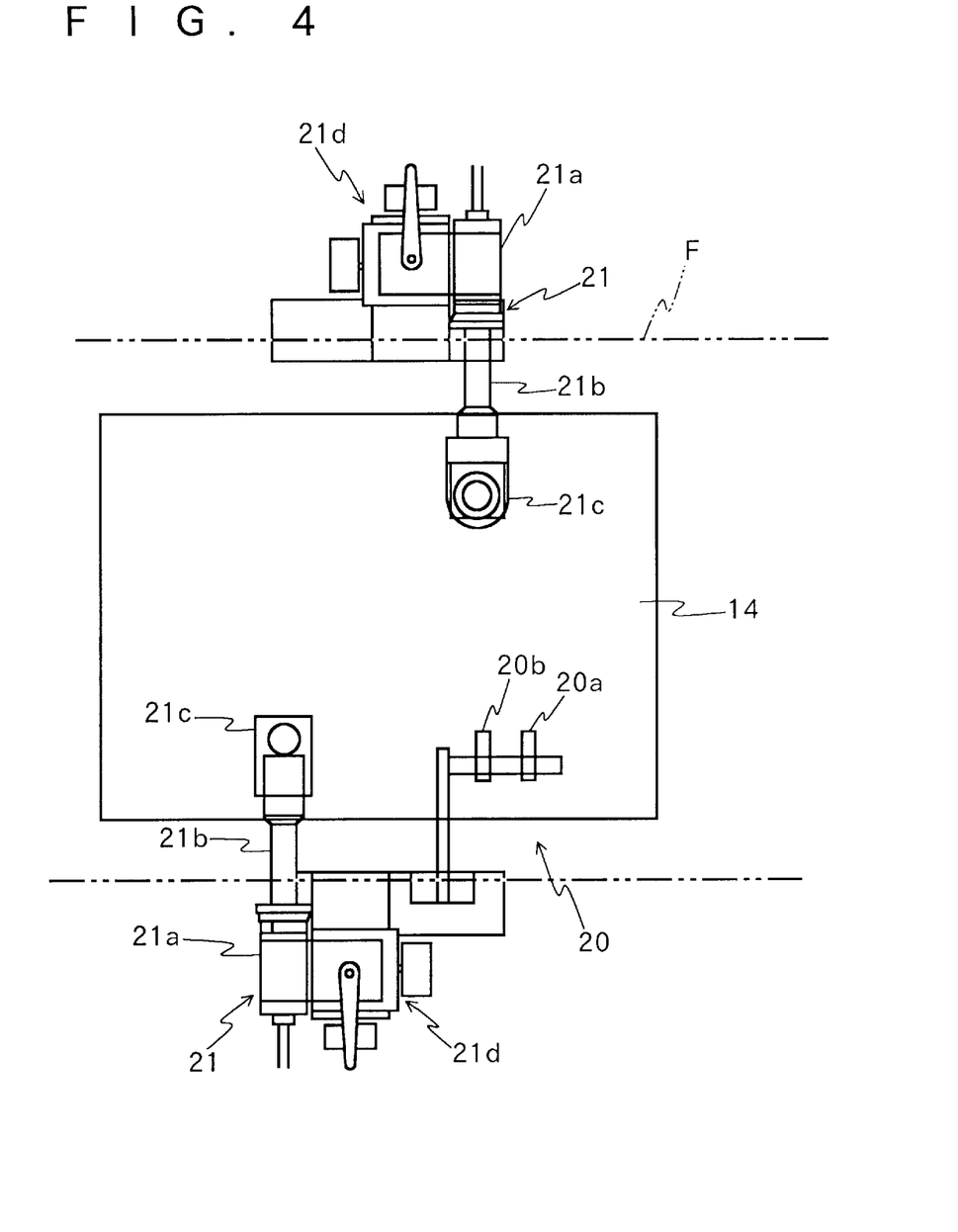
FIG. 4 is a top view showing a detailed structure of feed stop position detecting mechanism and image pickup mechanism.
Figure 5:
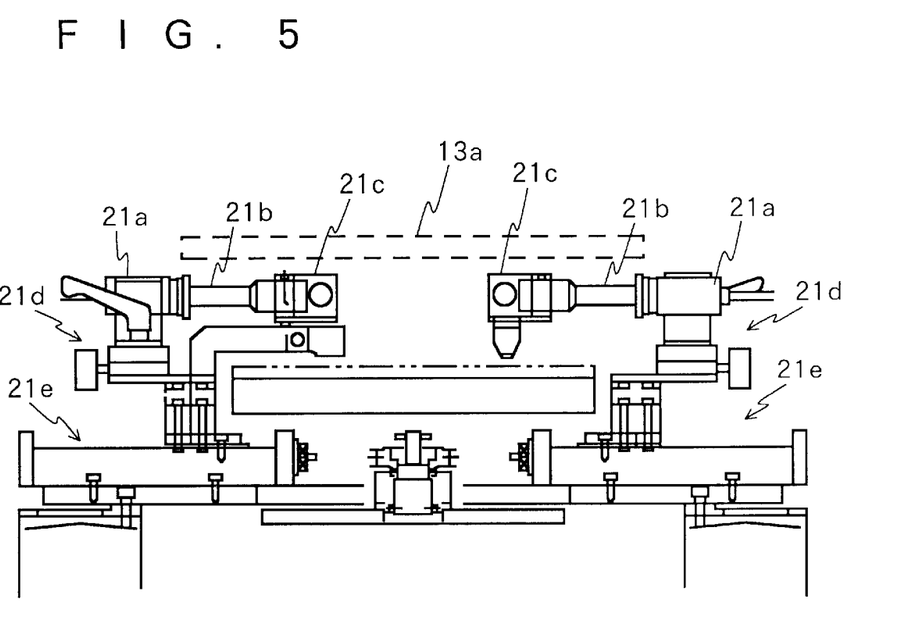
FIG. 5 is a view of feed stop position detecting mechanism and image pickup mechanism as seen from a direction parallel to the feed direction of the object of printing.
Figure 6:
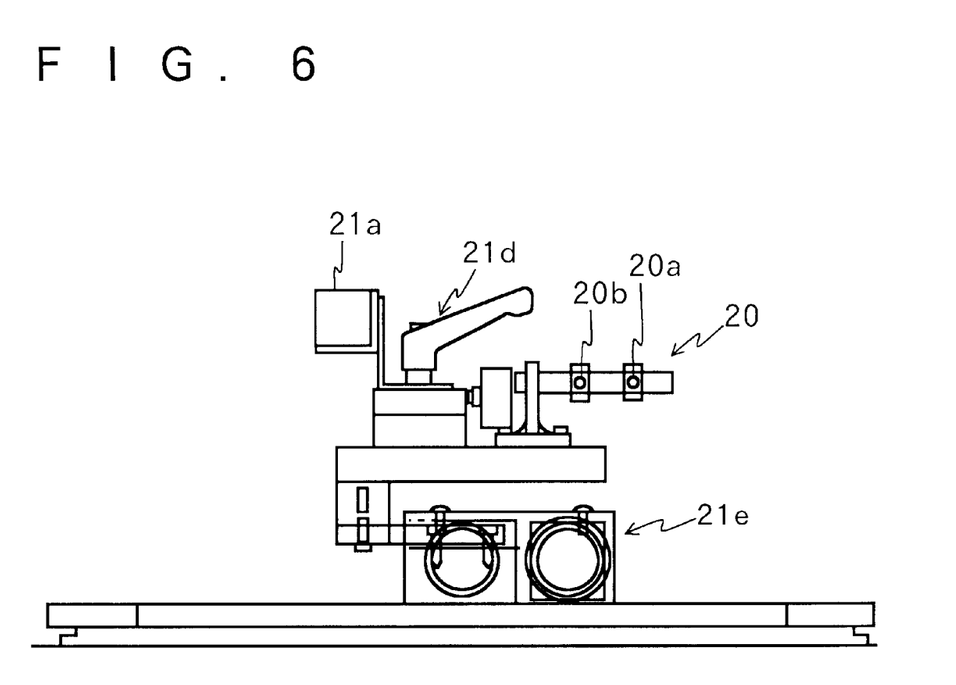
FIG. 6 is a view of feed stop position detecting mechanism and image pickup mechanism as seen from a direction vertical to the feed direction of the object of printing.

FIG. 4 to FIG. 6 show a schematic structure of the feed stop detecting mechanism 20 and image pickup mechanism 21, and the feed stop detecting mechanism 20 comprises a deceleration start position detecting sensor 20a for detecting the deceleration start position of film feed action by the suction roller 19, and a stop position detecting sensor 20b for detecting the stop position for stopping the decelerated feed action.

That is, when the deceleration start position detecting sensor 20a detects the stop mark 41 printed corresponding to each print pattern P, the feed speed of the PET film F by the suction roller 19 is decelerated, and when the stop position detecting sensor 20b detects the stop mark 41, feed of the PET film F by the suction roller 19 is stopped. In this manner, the operation for feeding the object of printing S by specified length each is executed.

The image pickup mechanism 21 comprises two CCD cameras 21a for taking the positioning marks 42 disposed at both sides of the PET film F, a lens 21b provided in each CCD camera 21a for magnifying and taking the positioning mark 42, a prism 21c provided in each lens 21b for converting the taking angle by 90 degrees, a camera position adjusting mechanism 21d for adjusting the position of each CCD camera 21a, and a camera withdrawing mechanism 21e for withdrawing each CCD camera 21a from between the object of printing S and the screen 13a at the time of printing.

Figure 7:
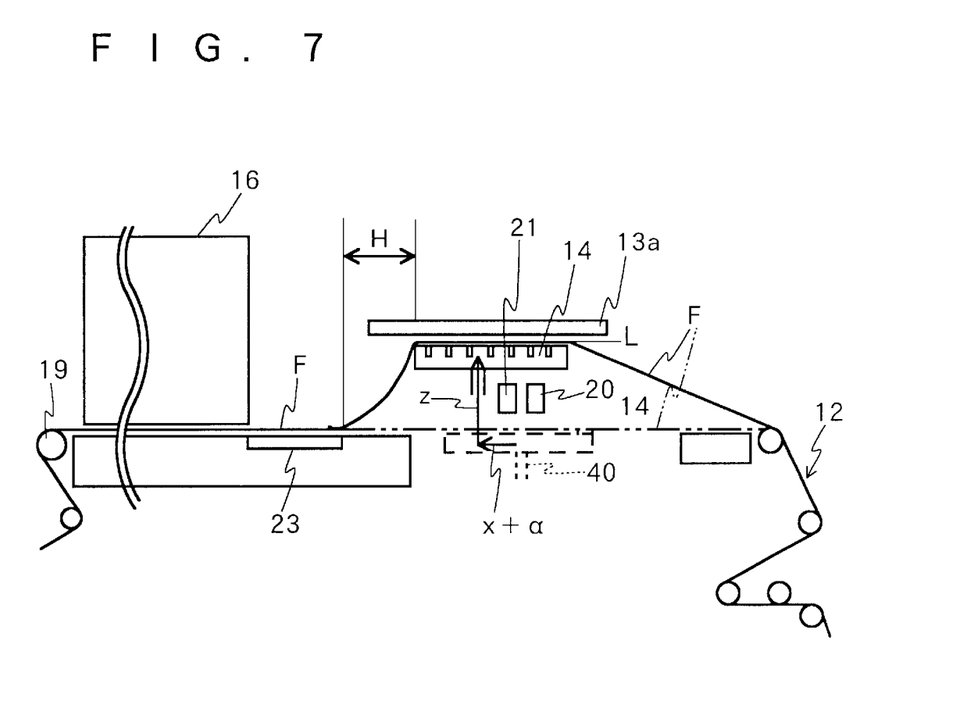
FIG. 7 is an explanatory diagram for explaining the operation of the machine in FIG. 1.

Referring to FIG. 7, the operation of this printing machine 10 is described.

By the detection result of the feed stop position detecting mechanism 20, when the feed action of the PET film F by the suction roll 19 is stopped and the positioning marks 42 are taken by the image pickup mechanism 21, deviations of the registration print patterns P formed in the printing area S from the specified position are calculated depending on the image pickup result ($-\alpha$, $-\beta$, $-\theta$). Herein, $-\alpha$: deviation in X-axis direction, $-\beta$: deviation in Y-axis direction, and $-\theta$: deviation in rotation direction about rotary shaft 40.

The controller 22 moves the feed stop position detecting mechanism 20 and image pickup mechanism 21 away from the object of printing S and screen 13a at the time of printing, and the print pattern P formed in the printing area S is lifted to the print execution position L just beneath the screen by means of the Z-axis driving mechanism 34 by distance (z), and depending on the calculated deviations ($-\alpha$, $-\beta$, $-\theta$), the print table 14 is moved in the X-axis direction by the X-axis driving mechanism 31 by distance (x+$\alpha$), and is also moved in the Y-axis direction by the Y-axis driving mechanism 32 by distance ($\beta$), and rotated by the rotary driving mechanism 33 by angle ($\theta$) about the rotary shaft 40. Herein, (x) is the distance of moving the PET film F containing the object of printing S to the feed direction side by a specified length, so that the printed portion of the object of printing S at the drying oven side (the specified length feed direction side) may be slackened for a specific interval H at the drying oven 16 side of the object of printing S. This distance (x) is constant regardless of the detected deviations ($-\alpha$, $-\beta$, $-\theta$). Similarly, the distance (z) is constant regardless of the detected deviations ($-\alpha$, $-\beta$, $-\theta$). As clear from the description herein, it is understood the film slackening means or the print table sliding and lifting means may be formed by the X-axis driving mechanism 31 and Z-axis driving mechanism 34.

When the print table 14 is moved to the printing position L by means of the driving mechanisms 31 to 34, the suction roll 19 is stopped in a state of sucking the PET film F, the thrusting mechanism 23 thrusts the PET film F downward just before the drying oven 16, and the reel feed tension rollers group 12 weakens the tension of the PET film F from that of feed operation. As a result, when moving the print table 14 in the X-axis direction by distance (x+$\alpha$) by means of the X-axis driving mechanism 31, the print patterns P formed in the object of printing S are free from deviation in position.

Thus, according to the printing machine 10 of the embodiment, since the PET film F is fed by an extra distance of (x) in the feed direction of the object of printing S, when the object of printing S is lifted up to the printing position L just beneath the screen, the PET film F is lifted together with the print patterns P formed in the objects of printing mounted on the print table 14, thereby preventing occurrence of inconvenience such as soiling of drying oven 16 and others due to contact with other member such as inlet of drying oven 16, or peeling of printed matter. As a result, the product quality and yield are improved.

The invention is described so far by referring to the embodiment, but it must be noted that the invention is not limited to the illustrated embodiment alone, and may be changed and modified in various forms. For example, in the embodiment, the invention is applied to the reel feed screen printing, but the invention is not limited to reel feed screen printing alone, but may be applied in various printing machines in which the print table and the drying oven are placed closely to each other.

As described herein, according to the invention, at the time of printing, the printed portion of the film positioned at the drying oven side is prevented from contacting, for example, with the inlet upper side of the drying oven to cause damage. As a result, not only the product quality and yield are improved, but also soiling of drying oven inlet and others with ink or the like can be avoided.

I claim:

1. A method for reel feed screen printing on designated printing areas on a roll of film, comprising the steps of:

incrementally feeding the film between a feed roller assembly and a reel-up roller assembly in a film feed forward direction through a printing mechanism and a print table and subsequently though a drying oven disposed downstream of the printing mechanism and print table and upstream of the reel-up assembly;

holding the film on the print table;

moving the print table with the film held thereon to locate a designated one of the printing areas on the film at a print execution position beneath the printing mechanism;

slackening the film at a drying oven side thereof upon moving the print table; and executing a screen printing function at the designated one of the printing areas on the film.

2. A method for reel feed screen printing according to claim 1, further comprising the step of thrusting a segment of the film positioned immediately before the drying oven downwardly upon moving the print table and executing the screen printing function.

3. A reel feed screen printing machine for performing screen printing on designated printing areas on a roll of film mounted on a reel feed roller assembly and a reel-up roller assembly, the film being fed from the feed roller assembly to the reel-up roller assembly in a film feed forward direction, the reel feed screen printing machine comprising:

a printing mechanism operative for executing a screen printing function on each one of the designated printing areas on the film, the printing mechanism disposed between the reel feed roller assembly and the reel-up roller assembly;

a drying oven disposed between the printing mechanism and the reel-up roller assembly and operative to dry print on the designated printing areas of the film after execution of the screen printing function;

a print table for holding the film when executing the screen printing function, the print table disposed below the printing mechanism;

a print table driving mechanism operative for moving the print table with the film held thereon to locate one of the designated print areas at a print execution position beneath the printing mechanism; and means for slackening the film at a drying oven side thereof upon moving the print table to locate the one of the designated print areas at the print executing position.

4. A reel feed screen printing machine according to claim 3, further comprising means for thrusting the film positioned immediately before the drying oven downwardly upon moving the print table to locate the one of the designated print areas at the print execution position and executing the screen printing function.

* * * * *